United States Patent
Kossel et al.

(10) Patent No.: US 9,590,597 B2
(45) Date of Patent: Mar. 7, 2017

(54) VOLTAGE-CONTROLLED RING OSCILLATOR WITH DELAY LINE

(71) Applicant: International Business Machines Corporation, Armonk, NY (US)

(72) Inventors: Marcel A Kossel, Reichenburg (CH); Daihyun Lim, Edgewater, NJ (US); Pradeep Thiagarajan, Chapel Hill, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/969,127

(22) Filed: Dec. 15, 2015

(65) Prior Publication Data
US 2016/0173069 A1    Jun. 16, 2016

(30) Foreign Application Priority Data

Dec. 16, 2014    (GB) .................................. 1422334.1

(51) Int. Cl.
*H03K 3/03*    (2006.01)
*H03K 5/134*    (2014.01)
*H03K 5/00*    (2006.01)

(52) U.S. Cl.
CPC ......... *H03K 3/0315* (2013.01); *H03K 3/0322* (2013.01); *H03K 5/134* (2014.07); *H03K 2005/00052* (2013.01)

(58) Field of Classification Search
CPC ...... H03K 3/0315; H03K 3/0322; H03K 5/13; H03K 5/133; H03K 5/134; H03K 5/14; H03K 2005/00052
See application file for complete search history.

(56) References Cited

U.S. PATENT DOCUMENTS

| 5,841,325 A  * | 11/1998 | Knotts ................. | H03K 3/0231 331/177 R |
| 6,794,912 B2 * | 9/2004 | Hirata .................. | H03K 5/1504 327/158 |
| 7,274,236 B2 * | 9/2007 | Lee ...................... | H03H 11/265 327/158 |

(Continued)

OTHER PUBLICATIONS

Wei-Bin Yang, et al., A Multiple Frequency Clock Generator using Wide Operation Frequency Range Phase Interpolator, Microelectronics Journal, Aug. 2013, 688-695, 44-8, Elsevier Science, Amsterdam, The Netherlands.

(Continued)

*Primary Examiner* — Ryan Johnson
(74) *Attorney, Agent, or Firm* — Mercedes Hobson (57) ABSTRACT

The invention relates to a multi-phase oscillator for generating multiple phase-shifted oscillator signals including: a ring oscillator having a number of concatenated oscillator delay cells which are interconnected to generate an oscillator signal, wherein phase-shifted oscillator signals are generated between the oscillator delay cells; a phase-blending unit configured to receive two phase-shifted oscillator signals and to generate a mid-phase oscillator signal whose phase shift is between the shifts of the two phase-shifted oscillator signals; and an interpolator delay line having a number of concatenated interpolator delay cells to generate further phase-shifted oscillator signals.

10 Claims, 4 Drawing Sheets

(56) References Cited

U.S. PATENT DOCUMENTS

| | | |
|---|---|---|
| 7,315,219 B2 | 1/2008 | Chiang |
| 7,839,196 B2 | 11/2010 | Yoon |
| 7,899,422 B1 | 3/2011 | Song et al. |
| 8,513,987 B1 | 8/2013 | Evans et al. |
| 8,624,645 B2 | 1/2014 | Ma |
| 8,674,773 B2 | 3/2014 | Nedovic |
| 9,209,821 B2 * | 12/2015 | Bichan ................ H03L 7/0998 |

OTHER PUBLICATIONS

Lixin Yang et al., An Arbitrary Skewable Multiphase Clock Generator Combining Direct Interpolation with Phase Error Average, IEEE International Symposium on Circuits and Systems, 2003, 645-648, Competence Center for Circuit Design, Department of Electroscience, Lund University, Lund, Sweden.

\* cited by examiner

VOLTAGE-CONTROLLED RING OSCILLATOR WITH DELAY LINE

CROSS-REFERENCE TO RELATED APPLICATION

This application claims the benefit of priority from United Kingdom Patent Application No. 1422334.1, filed Dec. 16, 2014, the contents of which are incorporated herein by reference.

FIELD OF THE INVENTION

The present invention relates to a controlled oscillator formed with a plurality of delay elements and providing multi-phase tabs. In particular, the present invention is related to high-speed controlled oscillators for multiple phases.

BACKGROUND

Multi-phase ring oscillators, as e.g. used in multi-phase phase-locked loop circuits, are typically used in receivers of high-speed serial links for the phase adjustment of the sampling clock. They provide multiple phases to a phase interpolator or phase rotator which in turn provides the sampling clock in a clock data recovery circuit. Other fields of application are phased-array antenna systems, where high-frequency multi-phase clock generation is also required.

Multi-phase generation is typically implemented by means of a ring oscillator including two or more delay cells interconnected to form a ring, so that such a device naturally provides multiple phases at each tap/output of the delay cells. The concatenation of delay cells, i.e. ring of delay cells, oscillates at a frequency proportional to 1/N, where N is the number of delay cells in the ring, and allows for increasingly high frequencies with a decreasing number of delay cells. However, the more phases the application requires, the higher the number of delay cells must be chosen, so that the oscillation frequency is substantially reduced. Thus, it is generally difficult to design a high-frequency multi-phase generator having a reasonable number of phase shift taps.

U.S. Pat. No. 8,624,645 discloses a multi-phase clock signal generator including a ring phase-shifting loop having a plurality of output terminals and phase-shifting units for phase shifting in input clock signals to generate output clock signals with different phases, wherein the output clock signals are respectively output at different output terminals respectively located between the phase-shifting units.

U.S. Pat. No. 7,315,219 discloses a multi-phase voltage-controlled oscillator for providing a plurality of signals having the same frequency but different phases according to a control voltage. The multi-phase voltage-controlled oscillator includes a plurality of ring oscillator units, each having a plurality of phase delay elements and a plurality of first connecting nodes, wherein the phase delay elements in each of the ring oscillator units are electrically series-connected to one another through the first connecting nodes and a single resistor ring having a plurality of resistor elements and a plurality of second connecting nodes, wherein the resistor elements are electrically series-connected to one another through the second connecting nodes. The second connecting nodes are electrically connected to the first connecting nodes of the ring oscillator units, so that the first connecting nodes of the ring oscillator units provide a plurality of signals having the same frequency but different phases. One disadvantage of the disclosed multi-phase voltage-controlled oscillator is that it has a high complexity of the circuitry and a poor phase accuracy since the resistor network introduces a mutual dependency between the individual VCOs.

U.S. Pat. No. 8,624,645 discloses a multi-phase clock signal generator, including: a ring phase shifting loop including a plurality of controllable delay cells, for generating output clock signals having different phases via the controllable delay cells according to a input clock signal, wherein delay amount of the controllable delay cells are determined by a biasing voltage; a phase skew detecting circuit, for computing phase differences of the output clock signals to generate a phase skew detecting signal; and a biasing circuit for providing the biasing voltage according to the phase skew detecting signal.

SUMMARY OF THE INVENTION

According to an embodiment of the invention, a multi-phase oscillator for generating multiple phase-shifted oscillator signals is provided, including: a ring oscillator having a number of concatenated oscillator delay cells which are interconnected to generate an oscillator signal, wherein phase-shifted oscillator signals are generated between the oscillator delay cells; a phase-blending unit configured to receive two phase-shifted oscillator signals and to generate a mid-phase oscillator signal whose phase shift is between the phase shifts of the two phase-shifted oscillator signals; and an interpolator delay line having a number of concatenated interpolator delay cells to generate further phase-shifted oscillator signals based on the mid-phase oscillator signal.

BRIEF DESCRIPTION OF THE DRAWINGS

Embodiments will be described in more detail in conjunction with the accompanying drawings, in which.

DETAILED DESCRIPTION OF THE PREFERRED EMBODIMENTS

Figure 1:
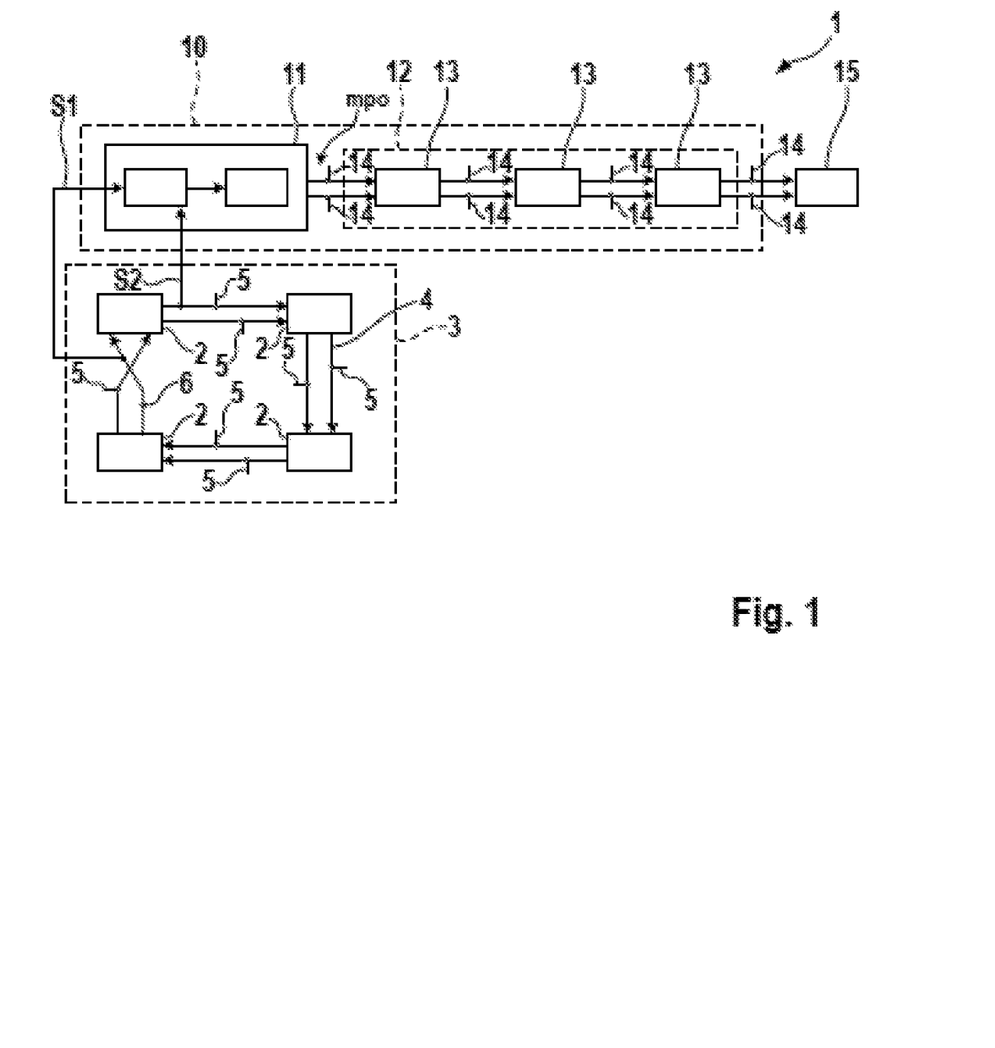
FIG. 1 shows a block diagram of a ring oscillator with an additional phase interpolator for providing additional mid phases.

FIG. 1 schematically shows a configuration of a multi-phase oscillator 1 having a plurality of oscillator delay cells 2 which are serially coupled to form a ring oscillator 3. Each oscillator delay cell 2 can be configured as a differential inverter, a schematic of which is exemplarily shown in FIG. 2. The outputs of the oscillator delay cells 2 are coupled to inputs of a next oscillator delay cell 2, so that a concatenation of oscillator delay cells 2 or a ring oscillator 3 is formed.

The ring oscillator 3 has a number of oscillator delay cells 2 whose outputs are respectively coupled to an input of a next oscillator delay cell 2. In a differential configuration, each of the oscillator delay cells 2 has a first input, a second input, a first output and a second output. A signal applied to the first input is inverted and the inverted signal is applied to the first output after a predetermined delay. Analogously, a signal applied to the second input is inverted and the inverted signal is applied to the second output after the predetermined delay. The oscillator delay cells 2 are preferably identical. Each of the oscillator delay cells 2 is preferably configured to have an equal delay tdelay.

Substantially, if the ring oscillator 3 has an odd number of oscillator delay cells 2, the first output of each oscillator delay cell 2 is coupled to a first input of a next (in the signal propagation direction) of the oscillator delay cells 2 and the second output of each oscillator delay cell 2 is coupled to a second input of a next (in the signal propagation direction) of the oscillator delay cells 2.

If the ring oscillator 3 has an even number of oscillator delay cells 2, one additional inversion is required. In detail for all but one of the oscillator delay cells 2 the first output of each oscillator delay cell 2 is coupled to a first input of a next (in the signal propagation direction) of the oscillator delay cells 2 and the second output of each oscillator delay cell 2 is coupled to a second input of a next (in the signal propagation direction) of the oscillator delay cells 2. The first input of the remaining one oscillator delay cell 2 is coupled to the second output of the preceding (in the signal propagation direction) oscillator delay cell 2 and the second input of the one oscillator delay cell 2 is coupled to the second output of the preceding (in the signal propagation direction) oscillator delay cell 2.

The oscillation frequency of such a ring oscillator 3 corresponds to $$\frac{1}{2N * t_{delay}},$$

wherein tdelay corresponds to the delay time of each of the oscillator delay cells 2 and N to the number of oscillator delay cells 2 in the ring oscillator 3. Consequently, the delay time tdelay corresponds to a phase shift.

The oscillator delay cells 2 can be configured as voltage-controlled oscillators as commonly known in the art, so that their delay times depend on a control voltage applied to a respective control input. The oscillator delay cells 2 are preferable controlled by the same control voltage so that they obtain a same delay.

In the present embodiment as shown in FIG. 1, four delay cells form the ring oscillator 3, so that a phase shift of 45° can be obtained at a tap/output of each delay cell.

Connection lines 4 between the two outputs of one of the oscillator delay cells 2 and the two inputs of the next oscillator delay cell 2 connected thereto carry two phase-shifted oscillator signals having a phase shift of 180° as the oscillator delay cells 2 provide differential outputs. The connection lines 4 between outputs and inputs of the oscillator delay cells 2 represent or are equipped with phase shift taps 5 to provide a number 2×N of phase-shifted oscillator signals in relation to the oscillator signal provided at one reference output 6 of one selected of the oscillator delay cells 2.

If a better resolution of phase shifts for the oscillator signal is needed, i.e. if phase-shifted oscillator signals with additional phase offsets shall be used, a mid-phase phase shift is provided in the form of a phase interpolator 10.

The phase interpolator 10 receives two different single phase-shifted oscillator signals S1, S2, i.e. from the two outputs of different oscillator delay cells 2 of the ring oscillator 3, e.g. from two outputs of subsequently arranged oscillator delay cells 2 of the ring oscillator 3. The two different single phase-shifted oscillator signals S1, S2 can be adjacent in phase domain. In the phase interpolator 10, the two different single phase-shifted oscillator signals S1, S2 are supplied to a phase-blending unit 11. The phase-blending unit 11 blends the received single phase-shifted oscillator signals S1, S2 and generates an oscillator signal having a phase shift that lies between the phase shifts of the received phase-shifted oscillator signals S1, S2.

At the output of the phase-blending unit 11, a mid-phase oscillator signal mpo is obtained. The mid-phase oscillator signal mpo can be differentially, i.e. as a non-inverted and inverted mid-phase oscillator signal mpo, provided to a subsequent interpolator delay line 12 having interpolator delay cells 13. The interpolator delay cells 13 should have the same propagation delay as the oscillator delay cells 2. Preferably, the configuration of the interpolator delay cells 13 is substantially identical to that of the oscillator delay cells 2 of the ring oscillator 3.

In case the oscillator delay cells 2 and interpolator delay cells 13 are configured to be voltage-controlled, the delay times of the oscillator delay cells 2 and the interpolator delay cells 13 are preferably set to be identical. To double the number of phase-shifted oscillator signals with respect to the number of phase-shifted oscillator signals provided by the ring oscillator 3, the number of delay cells 13 substantially is N−1.

The interpolator delay line 12 therefore provides further phase-shifted oscillator signals related to the mid-phase oscillator signal mpo supplied by the phase-blending unit 11. The further phase-shifted oscillator signals can be tapped at respective phase-shift interpolator taps 14. By using the interpolator delay line 12 of the interpolator unit 10, the number of phase shift taps 5 for providing a phase-shifted oscillator signal can be increased to 2×N with respect to the number N of oscillator delay cells 2 of the ring oscillator 3. Hence, even for ring oscillators 3 having a low number of oscillator delay cells 2, a significant number of phase shift taps 5 can be provided, which can conventionally be achieved by providing the double number of oscillator delay cells 2 in the ring oscillator 3. Generally, providing a low number of concatenated oscillator delay cells 2 in the ring oscillator 3 allows to achieve a high oscillation frequency which still provides a multi-phase output requiring a minimum area of circuitry and power overhead.

The last interpolator delay cell 13 of the interpolator delay line 12 can be connected to a dummy load cell 15 which provides a load to the last interpolator delay cell 13 which is identical as the load of each of the interpolator delay cells 13. Hence, the delay of the last interpolator delay cell 13 is not affected by the load connected thereto.

Furthermore, the above configuration allows for the design of smaller ring oscillators 3, as only half of the oscillator delay cells 2 and N−1 delay cells 13 of the mid-phase interpolators 10 are needed, so that the required area can be reduced with respect to an implementation with 2×N delay cells 3.

Figure 2:
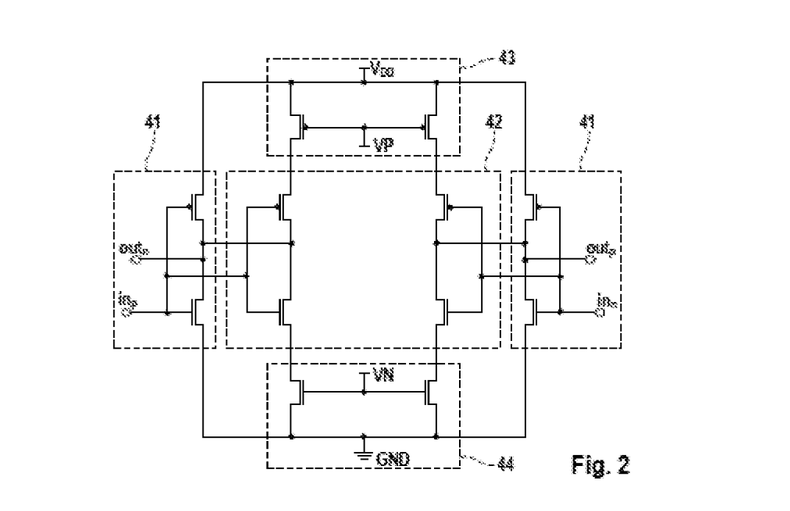
FIG. 2 shows an exemplary circuit diagram of an oscillator delay cell and an interpolator delay cell.

FIG. 2 schematically shows a circuit diagram of the oscillator delay cell 2 and the interpolator delay cell 13. The circuitry includes two identical fixed delay inverter stage 41 for receiving differential signal inputs inp, inn, respectively, and a tunable delay inverter stage 42 whose delay can be tuned by a header tail current source 43 and a footer tail current source 44, each controllable by a respective control voltage VP, VN, or any other kind of appropriate current mirror structure. The delay cell 2, 13 is configured to be differential and further provides a cross-coupling stage 45 with a cross-coupled inverter at the output of the delay cell 2, 13. Output signals outp, outn are commonly provided by the fixed delay inverter stages 41 and the tunable delay inverter stage 42. The stages can be implemented in CMOS, but similar designs in other circuit techniques such as for instance current mode logic (CML) might also be applicable.

Figure 3A:
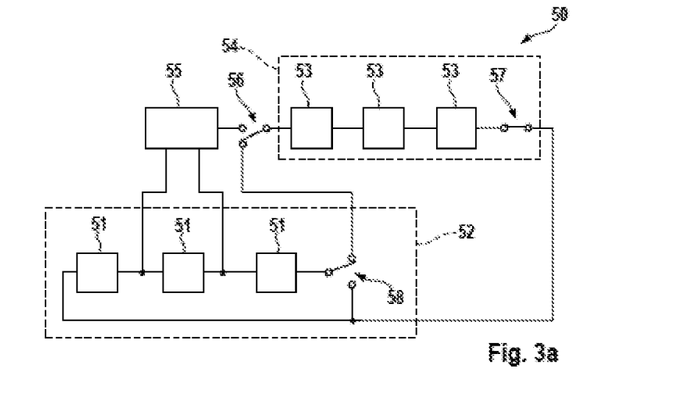
FIG. 3a shows a configuration of a ring oscillator with a configurable number of delay cells taken from the interpolator delay line in a first switching state of frequency range switches.
Figure 3B:
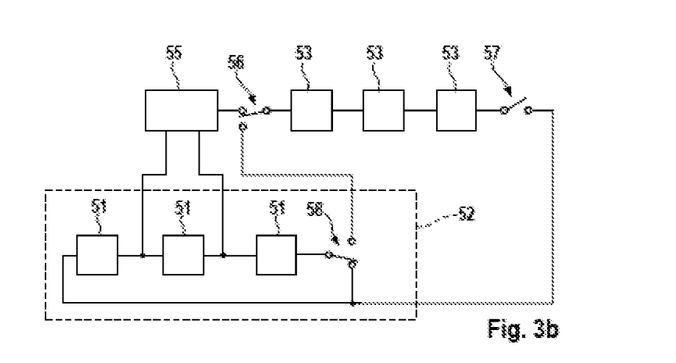
FIG. 3b shows a configuration of a ring oscillator with a configurable number of delay cells taken from the interpolator delay line in a second switching state of frequency range switches.

In FIGS. 3a and 3b, a tunable multi-phase oscillator 50 is provided which is configurable. The tunable multi-phase oscillator 50 comprises, as described before in more detail, oscillator delay cells 51 forming a ring oscillator 52, interpolator delay cells 53 forming an interpolator delay line 54 and a phase-blending unit 55. For better comprehension of the basic functionality, the blocks are drawn as non-differential (single-ended) blocks without limiting the scope of the invention. Thus, FIG. 3a shows a configuration of a ring oscillator with a configurable number of delay cells taken from the interpolator delay line in a first switching state of frequency range switches and FIG. 3b show a second switching state of frequency range switches.

By means of frequency range switches 56, 57, 58, the interpolator delay cells 53 can be used in the interpolator delay line 54 in the manner as described in conjunction with the embodiment of FIG. 1 in a first switching state as shown in FIG. 4a. For higher oscillation frequencies, the ring oscillator 52 can be formed with a low number of oscillator delay cells 51 while the remaining interpolator delay cells 53 can be used to provide mid-phase oscillator signals mpo as described before.

Further, the interpolator delay cells 53 can be used as part of the ring oscillator 52 in series connected to the oscillator delay cells 51 in a second switching state as shown in FIG. 4b. For lower oscillation frequencies, the interpolator delay cells 53 can be connected such that the ring oscillator 52 is formed with a higher number of delay cells. Thus, a wide range oscillator can be achieved, wherein the range of oscillation frequency is determined by the number of delay cells used in the ring oscillator 52 and the tuning range (voltage control) of the delay times of each of the delay cells 51, 53 might or might not have an overlap, depending on optimization.

In further configurations, further switches between the interpolator delay cells 53 can be provided to allow for selecting the number of interpolator delay cells 53 to be coupled in line with the oscillator delay cells 51 to form a ring oscillator 52 with a number of delay cells between N+1 and 2×N. In case intermediate ranges are required, additional switch configurations allow for selecting the number of delay cells in the ring oscillator 52 by picking the relevant delay cells to be part of the ring oscillator 52.

The configuration of FIGS. 3a and 3b circumvents the use of and the problems associated with a multi-phase frequency divider for lower-frequency usage. The conventional way of obtaining a lower frequency of a ring oscillator 52 is to divide the frequency using a multi-phase frequency divider whose implementation is challenging and can cause phase ambiguity issues resulting in a non-successive phase order after the multiphase divider. The possibility to selectively switch additional interpolator delay cells 53 into the ring oscillator 52 in order to obtain a lower oscillation frequency circumvents the use of a multi-phase frequency divider and the associated potential design issues.

Figure 4:
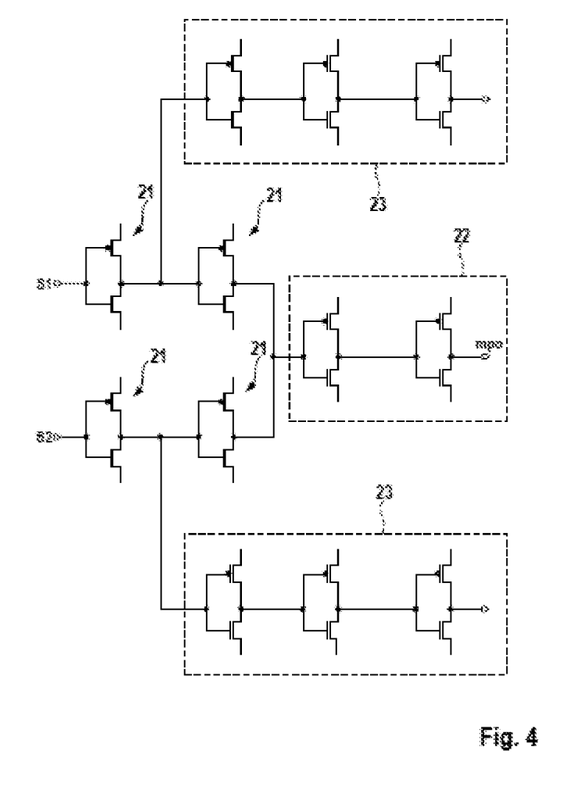
FIG. 4 shows an exemplary circuit diagram for a phase-blending unit.

FIG. 4 shows a phase-blending unit 11 receiving the phase-shifted oscillator signals S1, S2 at respective driving inverters 21 whose outputs are interconnected, so that a mid-phase oscillator signal mpo is obtained. The interconnected outputs of the driving inverters 21 are coupled to a driving stage 22 including two serially coupled inverters. To balance the load implied by the phase-blending unit 11, load balancing stages 23 can be provided. The load balancing stages 23 provide a chain of balancing inverters 24 between each of the delay cells 2, 13 so that the tapping of the two phase-shifted oscillator signals S1, S2 for application to the phase-blending unit 11 does not affect the delay of the oscillator delay cells 2.

The above embodied multi-phase oscillator can provide a ring formed of a number of delay cells, wherein the number of delay cells is reduced, so that a required high oscillation frequency can be achieved. In general, the number of phase taps substantially depends on the number of delay cells. Therefore, a lower number of phase taps respectively provided by the outputs of the number of delay cells results in a coarser phase spacing.

According to an embodiment the concatenation of oscillator delay cells is extended with at least one phase interpolator unit. This can overcome the drawback of a reduced number of phase taps in high-frequency oscillators with a low number N of oscillator delay cells. The phase interpolator unit can be configured to receive the phase outputs of two subsequent oscillator delay cells (adjacent phase outputs) and to interpolate the phase outputs to a mid-phase oscillator signal whose phase offset can be located between the phase offsets of the two phase outputs in the phase domain. The obtained mid-phase oscillator signal can be fed to an interpolator delay line including a number of up to N−1 interpolator delay cells preferably having the same delay as the oscillator delay cells. In this manner, multiple additional phase taps can be provided having phase shifts lying between the phase outputs provided by the outputs of the oscillator delay cells.

The number of phase taps in a ring oscillator can be either N (for single-ended oscillator delay cells) or 2N (for differential delay cells). For a single-ended configuration, by adding the phase blending unit and the interpolator delay cell(s) it is possible to generate any integer number of phase taps between N and 2N. However, due to the fact that a phase rotator in a receiver requires equidistant phase steps at its input, multi-phase oscillators with non-equidistant phase steps have no applications. The combination of an ring oscillator with N oscillator delay cells in combination with an interpolator delay line having a number P of concatenated interpolator delay cells can produce any integer number of phase taps between N+P for P={1, . . . N}.

Furthermore, if the oscillator is used for lower frequencies for which a 2N stage ring oscillator would also be applicable, the additional advantage of saving at least one delay cell and thereby saving circuit area can be provided.

Furthermore, the two phase-shifted oscillator signals received by the phase-blending unit can be applied by two subsequent oscillator delay cells of the concatenated oscillator delay cells.

It can be provided that the phase-blending unit is configured to generate the mid-phase oscillator signal with a phase shift which averages the phase shifts of the two phase-shifted oscillator signals received, i.e. the mid-phase is central between the phase shifts of the two phase-shifted oscillator signals received.

According to an embodiment, the number of concatenated oscillator delay cells in the ring oscillator can be 2 or 4 for differential oscillator delay cells or 3 for non-differential (single-ended) oscillator delay cells.

Moreover, the concatenated oscillator delay cells and the concatenated interpolator delay cells can have the same delay, wherein, in particular, the concatenated oscillator delay cells and the concatenated interpolator delay cells are identical in configuration. The concatenated oscillator delay cells and/or the concatenated interpolator delay cells can be configured as voltage-controlled delay cells.

Frequency range switches can be provided to selectively couple at least one of the interpolator delay cells into the concatenation of the oscillator delay cells in order to extend the ring oscillator, so that the oscillation frequency of the ring oscillator is reduced.

Furthermore, oscillator dummy load blocks can be provided at phase shift taps between those oscillator delay cells which are not connected to the phase-blending unit, so that the load is balanced between each of the oscillator delay cells. Moreover, an interpolator dummy load block can be provided at an output of the last interpolator delay cell, so that each of the interpolator delay cells has the same load at its output.

According to an embodiment the two phase-shifted oscillator signals received by the phase-blending unit can be chosen from the phase-shifted oscillator signals provided by the oscillator delay cells so that the mid-phase oscillator signal which is generated, substantially differs from any of the phase-shifted oscillator signals provided by the oscillator delay cells. According to a further embodiment, the interpolator delay cells and the oscillator delay cells can be configured for non-differential or differential operation.

What is claimed is:

1. Multi-phase oscillator for generating multiple phase-shifted oscillator signals comprising:
a ring oscillator having a number of concatenated oscillator delay cells which are interconnected to generate an oscillator signal, wherein phase-shifted oscillator signals are generated between the oscillator delay cells;
a phase-blending unit configured to receive two phase-shifted oscillator signals and to generate a mid-phase oscillator signal mpo whose phase shift is between the shifts of the two phase-shifted oscillator signals;
an interpolator delay line having a number of concatenated interpolator delay cells to generate further phase-shifted oscillator signals based on the mid-phase oscillator signal; and
wherein the concatenated oscillator delay cells and the concatenated interpolator delay cells have the same delay, in particular the concatenated oscillator delay cells and the concatenated interpolator delay cells are identical in configuration.

2. Oscillator according to claim 1, wherein the two phase-shifted oscillator signals received by the phase-blending unit are applied by two subsequent oscillator delay cells of the concatenated oscillator delay cells.

3. Oscillator according to claim 1, wherein the phase-blending unit is configured to generate the mid-phase oscillator signal mpo with a phase shift which averages the phase shifts of the two phase-shifted oscillator signals received.

4. Oscillator according to claim 1, wherein the number of concatenated oscillator delay cells in the ring oscillator is 2 to 4.

5. Oscillator according to claim 1, wherein the concatenated oscillator delay cells and/or the concatenated interpolator delay cells are configured as voltage-controlled delay cells.

6. Oscillator according to claim 1, wherein the interpolator delay cells and the oscillator delay cells are configured for non-differential or differential operation.

7. Oscillator according to claim 1, wherein the two phase-shifted oscillator signals received by the phase-blending unit are selected from the phase-shifted oscillator signals provided by the oscillator delay cells so that the mid-phase oscillator signal mpo which is generated, substantially differs from any of the phase-shifted oscillator signals provided by the oscillator delay cells.

8. Multi-phase oscillator for generating multiple phase-shifted oscillator signals comprising:
a ring oscillator having a number of concatenated oscillator delay cells which are interconnected to generate an oscillator signal, wherein phase-shifted oscillator signals are generated between the oscillator delay cells;
a phase-blending unit configured to receive two phase-shifted oscillator signals and to generate a mid-phase oscillator signal mpo whose phase shift is between the shifts of the two phase-shifted oscillator signals;
an interpolator delay line having a number of concatenated interpolator delay cells to generate further phase-shifted oscillator signals based on the mid-phase oscillator signal; and
wherein frequency range switches are provided to selectively couple at least one of the interpolator delay cells into the concatenation of the oscillator delay cells in order to extend the ring oscillator, so that the oscillation frequency of the ring oscillator is reduced.

9. Multi-phase oscillator for generating multiple phase-shifted oscillator signals comprising:
a ring oscillator having a number of concatenated oscillator delay cells which are interconnected to generate an oscillator signal, wherein phase-shifted oscillator signals are generated between the oscillator delay cells;
a phase-blending unit configured to receive two phase-shifted oscillator signals and to generate a mid-phase oscillator signal mpo whose phase shift is between the shifts of the two phase-shifted oscillator signals;
an interpolator delay line having a number of concatenated interpolator delay cells to generate further phase-shifted oscillator signals based on the mid-phase oscillator signal; and
wherein oscillator dummy load blocks are provided at phase shift taps between those oscillator delay cells which are not connected to the phase-blending unit, so that the load is balanced between each of the oscillator delay cells.

10. Multi-phase oscillator for generating multiple phase-shifted oscillator signals comprising:
a ring oscillator having a number of concatenated oscillator delay cells which are interconnected to generate an oscillator signal, wherein phase-shifted oscillator signals are generated between the oscillator delay cells;
a phase-blending unit configured to receive two phase-shifted oscillator signals and to generate a mid-phase oscillator signal mpo whose phase shift is between the shifts of the two phase-shifted oscillator signals;
an interpolator delay line having a number of concatenated interpolator delay cells to generate further phase-shifted oscillator signals based on the mid-phase oscillator signal; and wherein an interpolator dummy load block is provided at an output of the last interpolator delay cell, so that each of the interpolator delay cells has the same load at its output.

* * * * *